(12) United States Patent
Li et al.

(10) Patent No.: US 6,628,545 B1
(45) Date of Patent: Sep. 30, 2003

(54) MEMORY CIRCUIT FOR SUPPRESSING BIT LINE CURRENT LEAKAGE

(75) Inventors: Jiang Li, San Jose, CA (US); Yider Wu, Campbell, CA (US); Zhizheng Liu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/306,080

(22) Filed: Nov. 26, 2002

(51) Int. Cl.[7] .......................... G11C 16/04; G11C 16/06
(52) U.S. Cl. ..................... 365/185.05; 365/185.18; 365/185.21; 365/185.29; 365/185.3
(58) Field of Search ................. 365/185.05, 185.18, 365/185.21, 185.24, 185.29, 185.3, 185.33

(56) References Cited

U.S. PATENT DOCUMENTS

| | | | | |
|---|---|---|---|---|
| 5,357,476 A | * | 10/1994 | Kuo et al. | 365/185.3 |
| 5,400,286 A | * | 3/1995 | Chu et al. | 365/185.24 |
| 5,579,274 A | * | 11/1996 | Van Buskirk et al. | 365/185.3 |
| 5,790,456 A | * | 8/1998 | Haddad | 365/185.18 |
| 5,953,255 A | * | 9/1999 | Lee | 365/185.3 |
| 6,046,932 A | * | 4/2000 | Bill et al. | 365/185.33 |
| 6,157,572 A | * | 12/2000 | Haddad et al. | 365/185.33 |
| 6,160,737 A | * | 12/2000 | Hsu et al. | 365/185.24 |
| 6,188,609 B1 | * | 2/2001 | Sunkavalli et al. | 365/185.3 |
| 6,285,588 B1 | * | 9/2001 | Fastow | 365/185.29 |
| 6,285,599 B1 | * | 9/2001 | Shimada et al. | 365/185.3 |
| 6,407,948 B1 | * | 6/2002 | Chou | 365/185.29 |
| 6,515,910 B1 | * | 2/2003 | Lee et al. | 365/185.29 |

\* cited by examiner

*Primary Examiner*—Trong Phan
(74) *Attorney, Agent, or Firm*—Farjami & Farjami LLP

(57) ABSTRACT

A memory circuit employed in a memory device is disclosed. According to one embodiment, the memory circuit comprises a first memory cell and a second memory cell. The first memory cell has a drain terminal connected to a bit line, which is connected to a sensing circuit. The first memory cell also has a control gate connected to a word line. The second memory cell also has a drain terminal connected to the bit line. The second memory cell has its control gate coupled to ground. The memory circuit supplies a source voltage greater than a ground voltage to a source terminal of the first memory cell and to a source terminal of the second memory cell such that the gate-to-source voltage of the second memory cell is less than the threshold voltage of the second memory cell.

20 Claims, 2 Drawing Sheets

MEMORY CIRCUIT FOR SUPPRESSING BIT LINE CURRENT LEAKAGE

TECHNICAL FIELD

The present invention relates generally to the field of semiconductor devices. More particularly, the present invention relates to semiconductor memory devices.

BACKGROUND ART

Memory devices are known in the art for storing electronic data in a wide variety of electronic devices and applications. Electronic memory, for example, is widely used in a variety of commercial and consumer electronic products. A typical electronic memory device comprises a plurality of memory cells. Often, memory cells are arranged in an array format, where a row of memory cells corresponds to a word line, and where each memory cell defines a binary state, i.e., either a zero ("0") bit or a one ("1") bit. A column of memory cells are also connected together, normally by connecting the respective drain or source terminal of each memory cell in the column along the same bit line.

In certain memory devices, a memory cell may be defined as either being a "programmed" cell or an "erased" cell. According to one particular convention, a programmed cell is representative of a "0" bit, and an erased cell is representative of a "1" bit. The state of a memory cell is often determined by sensing the current drawn by the memory cell. For example, to ascertain the current drawn by a particular memory cell, the drain terminal of the memory cell is connected to a sensing circuit, the source terminal of the memory cell is connected to ground, and the control gate of the memory cell is selected. With these connections established, the sensing circuit attempts to detect the current drawn by the memory cell. The sensed memory cell current can then be compared against a reference current to determine whether the memory cell is an erased cell or a programmed cell. For example, if the sensed memory cell current exceeds the reference current, the memory cell is considered an erased cell (corresponding to a "1" bit). However, if the sensed memory cell current is below the reference current, the memory cell is considered a programmed cell (corresponding to a "0" bit).

As described above, the drain terminals of the memory cells in the same column are connected together along a common bit line. In certain cases, this common connection creates a problem during detection of current drawn by a selected memory cell. The problem arises when, for example, one or more of the other memory cells along the same bit line conduct current even though these other memory cells are not selected. Thus, the sensing circuit which attempts to detect the current drawn by the selected memory cell may also detect the current, if any, drawn by the other memory cells along the same bit line since the drain terminals of the memory cells are connected together along the same bit line. In these cases, the current for the selected memory cell may be sensed incorrectly, since the current drawn by the other memory cells contribute to the sensed current. Thus, the reliability of verification of the erased or programmed state of memory cells in memory devices is significantly reduced. Known approaches for dealing with this problem involve lengthy and slow procedures. Accordingly, there exists a strong need in the art to overcome deficiencies of conventional memory circuits, such as those described above, for quickly and reliably detecting memory cell current and for verifying the erased or programmed state of a memory cell during memory operations.

SUMMARY

The present invention is directed to a memory circuit for suppressing bit line current leakage. The present invention addresses and resolves the need in the art for quickly and reliably detecting memory cell current and for verifying the erased or programmed state of a memory cell during memory operations. According to one exemplary embodiment, the memory circuit comprises a first memory cell and a second memory cell. The first and second memory cells may, for example, comprise floating gate memory cells, each having corresponding threshold voltages. According to one embodiment, the threshold voltage of the first memory cell is greater than the threshold voltage of the second memory cell and wherein the memory circuit supplies a source voltage greater than a ground voltage.

The first memory cell has a drain terminal connected to a bit line, and the bit line is connected to a sensing circuit. The first memory cell also has a control gate connected to a word line, which supplies an appropriate voltage to activate the first memory cell. The second memory cell also has a drain terminal connected to the bit line. The second memory cell has its control gate coupled to ground. The source voltage is connected to a source terminal of the first memory cell and to a source terminal of the second memory cell. With this configuration, the gate-to-source voltage of the second memory cell is less than the threshold voltage of the second memory thereby reducing or eliminating the current drawn by second memory cell during verification of the first memory cell.

According to the present invention, current through the second memory cell is suppressed or eliminated during verification of the first memory cell. As such, the sensing circuit does not detect the first memory cell as an erased cell when the first memory cell is a programmed cell, even when the second memory cell is an over-erased cell. Other features and advantages of the present invention will become more readily apparent to those of ordinary skill in the art after reviewing the following detailed description and accompanying drawings.

DETAILED DESCRIPTION OF THE INVENTION

The present invention is directed to The present invention is directed to a memory circuit for suppressing bit line current leakage. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
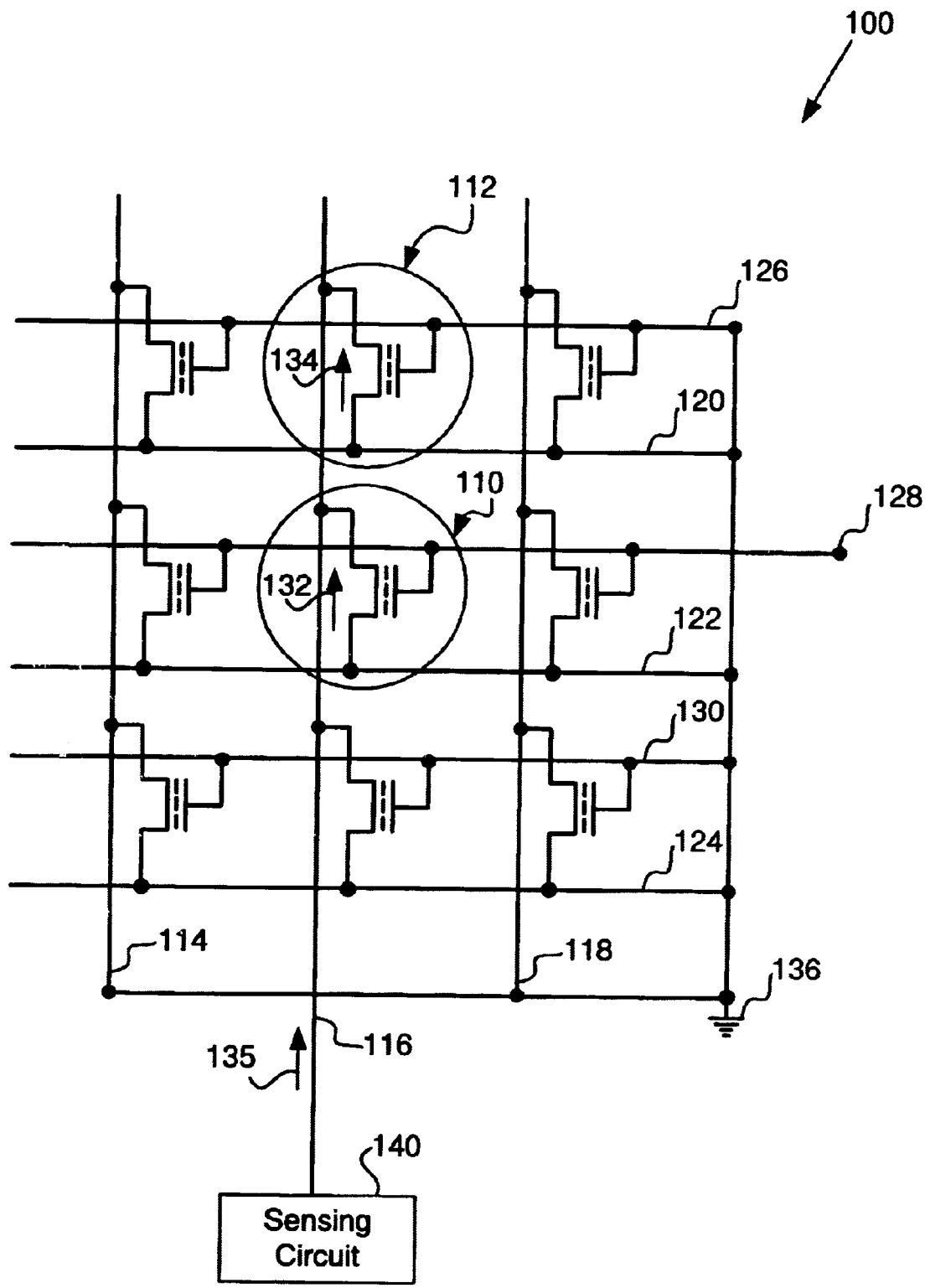
FIG. 1 depicts a schematic of a conventional memory circuit.

To illustrate the features and advantages of the present invention, a brief description of a known memory circuit 100 for detecting memory cell current is provided with reference to FIG. 1. Memory circuit 100 comprises a typical memory array comprising a plurality of memory cells, such as floating gate memory cells, for example, and includes memory cells 110 and 112. As shown in FIG. 1, memory cell 110 and memory cell 112 share a common connection via line 116. More particularly, the "drain" terminals of memory cells 110 and 112 are connected together by line 116. Other memory cells (not specifically shown or referred to in FIG. 1) may also be connected to line 116 in a similar manner. For purpose of the present application, line 116 can be thought of as a "bit line," and, as such, will be referred to herein as "bit line 116" for ease of reference. Likewise, lines 114 and 118 will be referred to as bit lines 114 and 118. In the exemplary embodiment shown in FIG. 1, memory cell 110 also has a control gate connected to line 128. The control gates of other memory cells may also be connected to and share line 128 as generally depicted in FIG. 1. For purpose of the present application, line 128 can be thought of as a "word line" and, as such, will be referred to herein as "word line 128" for ease of reference. Likewise, lines 126 and 130 will be referred to as word lines 126 and 130. The source terminals of the memory cells in memory circuit 100 are conventionally coupled to ground 136. Thus, lines 120, 122, and 124 are coupled to ground 136 as shown in FIG. 1.

Each memory cell in memory circuit 100 may be either a programmed cell (corresponding to a "0" bit) or an erased cell (corresponding to a "1" bit). As described above, the state of a memory cell can be determined by sensing the current drawn by the memory cell. A programmed memory cell may draw a low current, such as 10 microAmps ($\mu$A), for example, when selected, whereas an erased memory cell may draw a high current, such as 20 $\mu$A, for example, when selected. In the particular configuration shown in FIG. 1, memory circuit 100 is configured to detect current 132 drawn by memory cell 110. This operation may be carried out, for example, to verify whether memory cell 110 has been erased.

To detect current 132 drawn by memory cell 110, bit line 116, which is connected to the drain terminal of memory cell 110, is coupled to sensing circuit 140 which can comprise, for example, a sense amplifier. Memory cell 110 is selected by activating word line 128, which is coupled to the control gate of memory cell 110. For example, a voltage of 4.0 volts (V) may be supplied to the control gate of memory cell 110 by word line 128. In addition, connections are made to the other memory cells of memory circuit 100 in an attempt to turn off, or otherwise deselect, the other memory cells. Thus, word lines 126 and 130, which are connected to the control gates of the other memory cells, are coupled to ground 136. Additionally, bit lines 114 and 118 connected to the drain terminal of other memory cells are also connected to ground 136. These connections may be established by appropriate selection circuitry (not shown).

With the arrangement shown in FIG. 1, sensing circuit 140 connected to bit line 116 attempts to detect current 132 drawn by memory cell 110. In certain cases, however, one or more of the memory cells sharing bit line 116 with memory cell 110 may conduct current, even though their associated control gates are connected to ground. To illustrate this problem, consider memory cell 112 having its drain terminal connected to bit line 116. In some cases, the threshold voltage ($V_T$) of memory cell 112 may be below zero volts (0 V) causing memory cell 112 to behave as a depletion mode transistor. The $V_T$ of memory cell 112 is such cases may be in the range of about −0.1 to −0.2 V, for example. This condition of having a threshold voltage below zero may occur, for example, when the $V_T$ of memory cell 112 is greatly reduced during an erase operation involving memory cell 112; in such a case, memory cell 112 is said to be "over-erased." When this occurs, even though the control gate and source of memory cell 112 are connected to ground 136 and are therefore at zero volts (0V) and the $V_{GS}$ (i.e. the difference between the gate and source voltages) of memory cell 112 is equal to zero volts (0 V), the $V_T$ of memory cell 112, being less than zero volts, is still exceeded by its $V_{GS}$.

As a result, memory cell 112 is activated and draws current 134. Since memory cell 112 is connected to line bit 116, current 134 is added to current 132, the total of which is represented by current 135 which is sensed by sensing circuit 140 connected to bit line 116. When memory cell 110 is a programmed cell (normally associated with a low current draw), current 135 may be significantly increased due to the addition of current 134 through memory cell 112, and thus memory cell 110 may be incorrectly identified as an erased cell by sensing circuit 140. For purposes of the present application, the current drawn by memory cells other than memory cell 110 along the same bit line as memory cell 110, can be thought of as bit line current "leakage" and, as such, will be referred to as "bit line current leakage."

The conventional approach to resolving bit line current leakage has been to correct, i.e. to raise the threshold voltages of, the over-erased cells within memory circuit 100. This operation involves first identifying the over-erased cells, and then correcting the identified memory cells so that the memory cells operate as normal erased cells (instead of over-erased cells). Thereafter, the erased or programmed state of the memory cells of interest, for example memory cell 110 discussed above, can be properly verified. The lengthy processes involved in correcting over-erased cells are quite undesirable.

Figure 2:
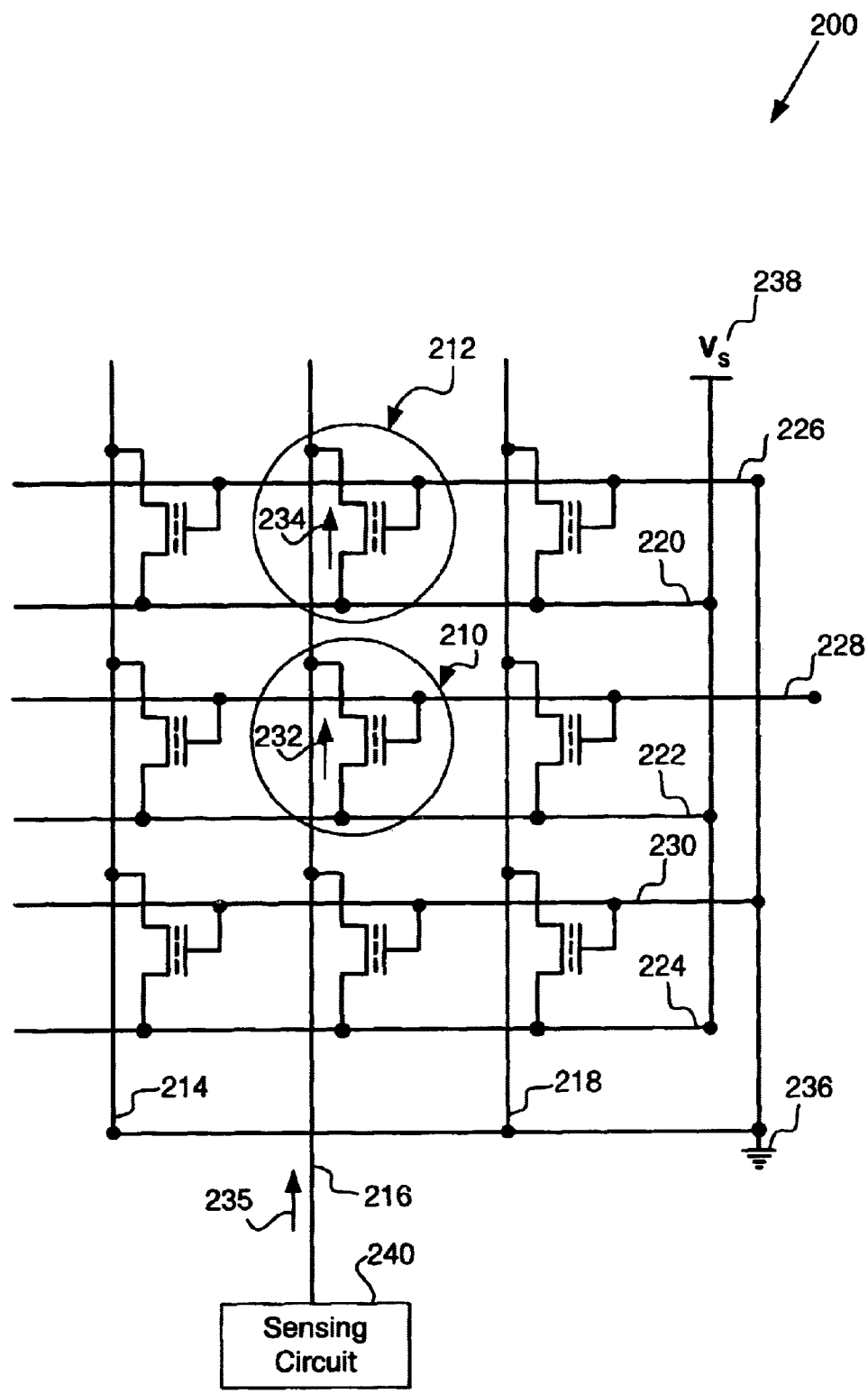
FIG. 2 depicts a schematic of a memory circuit according to one embodiment of the present invention.

Referring now to FIG. 2, there is shown a schematic of a memory circuit 200 according to one embodiment of the present invention which suppresses bit line current leakage during the verification of the state of memory cells of interest and thus generally overcomes the problems associated with over-erased cells as described above in conjunction with FIG. 1. The invention as described by reference to memory circuit 200 may be employed in electronic memory devices, such as flash memory devices, for example.

Memory circuit 200 comprises a memory array having a plurality of memory cells, such as floating gate memory cells, for example, although the present invention is also suitable for use with other types of memory cells. In the particular embodiment depicted in FIG. 2, memory circuit 200 is configured to detect current 232 drawn by memory cell 210. This operation may be carried out, for example, to verify whether memory cell 210 has been erased. For purposes of the present application and the discussion that follows in conjunction with the exemplary embodiment shown in FIG. 2, memory cell 210 may be referred herein to as the "selected memory cell" and memory cells other than memory cell 210 in memory circuit 200 may be referred herein to as the "non-selected memory cells."

As shown in FIG. 2, memory cell 210 and memory cell 212 of memory circuit 200 share bit line 216. More particularly, the drain terminals of memory cells 210 and 212 are connected together by bit line 216. Other memory cells (not specifically shown or referred to in FIG. 2) may also be connected to bit line 216 in a similar manner. Memory cell 210 also has a control gate connected to word line 228. The control gates of other memory cells may also be connected to and share word line 228 as generally depicted in FIG. 2. To detect current 232 drawn by memory cell 210, bit line 216, which is connected to the drain terminal of memory cell 210, is coupled to sensing circuit 240, such as a sense amplifier, for example. Memory cell 210 is selected by a signal supplied to word line 228, which is coupled to the control gate of memory cell 210.

In accordance with the present invention the source terminals of each of the memory cells in memory circuit 200 are connected to a source voltage ($V_S$) 238. Thus, lines 220, 222, and 224 are coupled to $V_S$ 238. $V_S$ 238 may supply a voltage of about 0.3 V, for example. Corresponding adjustments to voltages supplied to word line 228 and bit line 216 are carried out to take into account the voltage supplied to the source terminal of memory cell 210. These adjustments provide appropriate drain and control gate voltages for memory cell 210 so that memory cell 210 properly conducts when selected as described more fully below. As shown in FIG. 2, word lines 226 and 230, which are connected to the control gates of the other memory cells, are connected to ground 236. Additionally, bit lines 214 and 218, which are connected to the drain terminal of the other memory cells, are also connected to ground 236. These connections may be established by appropriate selection circuitry (not shown).

With the memory circuit 200, bit line current leakage through non-selected memory cells along bit line 216 is significantly reduced or eliminated. The reason is that memory circuit 200 reduces the gate-to-source voltage ($V_{GS}$) of the non-selected memory cells by applying $V_S$ 238 to the source terminals of each of the non-selected memory cells and coupling the control gates of the non-selected memory cells to ground 236. As a result, the possibility that the non-selected memory cells will be activated is substantially reduced or eliminated, even when one or more of the non-selected memory cells have very low or negative threshold voltages.

Consider, for example, memory cell 212, which is a non-selected memory cell in the particular embodiment shown in FIG. 2. Memory cell 212 may have a low or negative threshold voltage and thus behave as a depletion mode transistor due to being "over-erased" in a previous erase operation. For example, the $V_T$ of memory cell 212 may have a negative value, e.g., in the range of about –0.1 to –0.2 V. However, since $V_S$ 238 applies a positive voltage, such as a voltage of about 0.3 V, for example, to the source terminal of memory cell 212 at line 220, and since the control gate of memory cell 212 is coupled to ground 236, the VGS of memory cell 212 is less than the $V_T$ of memory cell 212, and thus memory cell 212 will not be activated. Current 234, which would also be considered bit line current leakage, through memory cell 212 is thereby substantially reduced or eliminated. Likewise, bit line current leakage associated with other non-selected memory cells connected to bit line 216 is also reduced or eliminated. Thus, sensing circuit 240, when detecting current 235, is able to more accurately detect current 232 through memory cell 210, since current 234 through memory cell 212 and any other bit line current leakage through other non-selected memory cells along bit line 216 are substantially reduced or eliminated. Accordingly, memory circuit 200 quickly and reliably detects memory cell current during memory operations to determine the erased or programmed state of memory cells, such as an "erase verify" operation utilized to verify the state of erased cells.

During a verification operation involving memory cell 210, appropriate drain and control gate voltages are supplied to the drain terminal and the control gate, respectively, of memory cell 210 in order to activate memory cell 210. In order to compensate for the positive voltage supplied to the source terminal of memory cell 210 by $V_S$ 238, the drain voltage supplied to memory cell 210 is increased relative to the drain voltages supplied in the conventional approach so that the drain to source voltage ($V_{DS}$) of memory cell 210 remains at an appropriate positive value. Also, the voltage supplied to the control gate of memory cell 210 is approximately the same as that supplied in the conventional approach, i.e. approximately 4.0 volts. To illustrate this aspect of the present invention, consider the conventional approach depicted in FIG. 1. In FIG. 1, a drain voltage of about 0.5 V and a control gate voltage of about 4.0 V are typically supplied to activate memory cell 110 having its source terminal connected to ground 136. In contrast, according to one embodiment of the present invention as shown in FIG. 2, $V_S$ 238 supplies a positive voltage, e.g., approximately 0.3 V, to the source terminals of each memory cell in memory circuit 200, including memory cell 210. To compensate for the positive voltage supplied to the source terminal of memory cell 210 by $V_S$ 238, a corresponding increase in the drain voltage relative to that supplied in the conventional approach is made to activate memory cell 210. Thus, a drain voltage of approximately 0.8 V (0.3 V greater than the conventional drain voltage of 0.5 V) and a control gate voltage of approximately 4.0 V are supplied to activate memory cell 210 having its source terminal connected to $V_S$ 238.

With memory circuit 200 and the approach of the present invention discussed above, the lengthy procedures of detecting and correcting over-erased cells are no longer required for memory operations involving memory cell current detection, such as "erase verify" operations. As such, improved speed and reliability in verification of the state of memory cells in memory devices is advantageously achieved. From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, various voltage levels, transistor types, and circuit interconnections can be modified without departing from the spirit and scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a memory circuit for suppressing bit line current leakage has been described.

What is claimed is:

1. A memory circuit in a memory device, said memory circuit comprising:
    a first memory cell having a drain terminal connected to a bit line, said bit line being further coupled to a sensing circuit, said first memory cell having a control gate connected to a word line, said first memory cell further having a first threshold voltage;
    a second memory cell having a drain terminal connected to said bit line, said second memory cell having a control gate coupled to ground, said second memory cell further having a second threshold voltage, said second threshold voltage being less than said first threshold voltage; and a source voltage connected to a source terminal of said first memory cell, said source voltage further connected to a source terminal of said second memory cell, said source voltage causing a gate-to-source voltage of said second memory cell to be less than said second threshold voltage.

2. The memory circuit of claim 1, wherein said first memory cell is a programmed cell.

3. The memory circuit of claim 1, wherein said sensing circuit does not detect said first memory cell as an erased cell.

4. The memory circuit of claim 1, wherein said second memory cell is an over-erased cell.

5. The memory circuit of claim 1, wherein said sensing circuit does not detect said second memory cell as an erased cell.

6. The memory circuit of claim 1, wherein said first threshold voltage of said first memory cell is greater than zero.

7. The memory circuit of claim 1, wherein said second threshold voltage of said second memory cell is less than zero.

8. The memory circuit of claim 1, wherein said source voltage is greater than a voltage of said ground.

9. A memory circuit in a memory device, said memory circuit comprising:

first memory means for storing at least one bit, said first memory means comprising a first memory cell having a drain terminal connected to a bit line, said bit line being further coupled to a sensing circuit, said first memory cell having a control gate connected to a word line, said first memory cell further having a first threshold voltage;

second memory means for storing at least one bit, said second memory means comprising a second memory cell having a drain terminal connected to said bit line, said second memory cell having a control gate coupled to ground, said second memory cell further having a second threshold voltage, said second threshold voltage being less than said first threshold voltage; and means for supplying voltage, said voltage supply means comprising a source voltage connected to a source terminal of said first memory cell, said source voltage further connected to a source terminal of said second memory cell, said source voltage causing a gate-to-source voltage of said second memory cell to be less than said second threshold voltage.

10. The memory circuit of claim 9, wherein said first memory cell is a programmed cell.

11. The memory circuit of claim 9, wherein said sensing circuit does not detect said first memory cell as an erased cell.

12. The memory circuit of claim 9, wherein said second memory cell is an over-erased cell.

13. The memory circuit of claim 9, wherein said sensing circuit does not detect said second memory cell as an erased cell.

14. The memory circuit of claim 9, wherein said first threshold voltage of said first memory cell is greater than zero.

15. The memory circuit of claim 9, wherein said second threshold voltage of said second memory cell is less than zero.

16. The memory circuit of claim 9, wherein said source voltage is greater than a voltage of said ground.

17. A memory circuit in a memory device, said memory circuit comprising:

a first memory cell having a drain terminal connected to a bit line, said bit line being further coupled to a sensing circuit, said first memory cell having a control gate connected to a word line, said first memory cell further having a first threshold voltage; and a second memory cell having a drain terminal connected to said bit line, said second memory cell having a control gate coupled to ground, said second memory cell further having a second threshold voltage, said second threshold voltage being less than said first threshold voltage, said memory circuit being characterized by:

a source voltage connected to a source terminal of said first memory cell, said source voltage further connected to a source terminal of said second memory cell, said source voltage causing a gate-to-source voltage of said second memory cell to be less than said second threshold voltage.

18. The memory circuit of claim 17, wherein said first memory cell is a programmed cell.

19. The memory circuit of claim 17, wherein said sensing circuit does not detect said first memory cell as an erased cell.

20. The memory circuit of claim 17, wherein said second memory cell is an over-erased cell.

* * * * *